United States Patent
Bacon et al.

(10) Patent No.: US 6,538,432 B1
(45) Date of Patent: Mar. 25, 2003

(54) HYSTERESIS LOOP TRACER WITH SYMMETRIC BALANCE COIL

(75) Inventors: Stanley H. Bacon, Van Nuys, CA (US); Barry B. Megdal, Northridge, CA (US)

(73) Assignee: SHB Instruments, Inc., Northridge, CA (US)

( * ) Notice: Subject to any disclaimer, the term of this patent is extended or adjusted under 35 U.S.C. 154(b) by 0 days.

(21) Appl. No.: 09/602,520

(22) Filed: Jun. 16, 2000

Related U.S. Application Data

(60) Provisional application No. 60/140,002, filed on Jun. 18, 1999.

(51) Int. Cl.[7] .............................................. G01R 33/14
(52) U.S. Cl. ........................ 324/223; 324/225; 324/228
(58) Field of Search ................................ 324/201, 222, 324/223, 225, 228, 232, 234, 236–243

(56) References Cited

U.S. PATENT DOCUMENTS

| | | | | |
|---|---|---|---|---|
| 3,375,440 A | * | 3/1968 | Morawetz et al. | 324/223 |
| 4,843,316 A | * | 6/1989 | Hesterman | 324/210 |
| 4,903,674 A | * | 2/1990 | Bassett et al. | 123/634 |

OTHER PUBLICATIONS

E. C. Crittenden, Jr. et al., *B–H Meter for Samples of Small Cross–Sectional Area*, The Review of Scientific Instruments, vol. 17, No. 10 Oct. 1946, pp. 372–374.

P.P. Coiffi, *A Recording Fluxmeter of High Accuracy and Sensitivity*, The Review of Scientific Instruments, vol. 21, No. 7 Jul. 1950, pp. 624–628.

D. H. Howling, *Simple 60–cps Hysteresis Loop Tracer for Magnetic Materials of High or Low Permeability*, The Review of Scientific Instruments, vol. 27, No. 11 Nov. 1956, pp. 952–956.

H. J. Oguey, *Sensitive Flux Measurement of Thin Magnetic Films*, The Review of Scientific Instruments, vol. 31, No. 7 Jul. 1960, pp. 701–709.

W. A. Fietz, *Electronic Integration Technique for Measuring Magnetization of Hysteretic Superconducting Materials*, The Review of Scientific Instruments, vol. 36, No. 11 Nov. 1965, pp. 1621–1626.

Floyd B. Humphrey, *Magnetic Measurement Techniques for Thin Films and Small Particles*, Journal of Applies Physics, vol. 38, No. 3 Mar. 1, 1967, pp. 1520–1527.

Homer Fay, *Magnetic Hysteresis Loop Tracer using Operational Amplifiers*, The Review of Scientific Instruments, vol. 43, No. 9 Sep. 1972, pp. 1274–1279.

* cited by examiner

*Primary Examiner*—Jay Patidar
(74) *Attorney, Agent, or Firm*—Knobbe, Martens, Olson & Bear LLP

(57) ABSTRACT

A geometry for a pickup coil assembly that improves the balance of a hysteresis loop tracer is described. First and second balance coils are placed on either side of a pickup coil. The first and second balance coils are wired in series to form a symmetric balance coil that senses the magnetic H field on either side of the pickup coil. The voltage produced by the symmetric balance coil is subtracted from the voltage produced by the pickup coil. This geometry reduces susceptibility to external electromagnetic fields and also reduces susceptibility to changes in the uniformity of the drive field. Mechanical and thermal stability is improved by physically connecting the balance and pickup coils together. Mechanical and thermal stability is further improved by winding the coils on alumina coil forms.

30 Claims, 12 Drawing Sheets

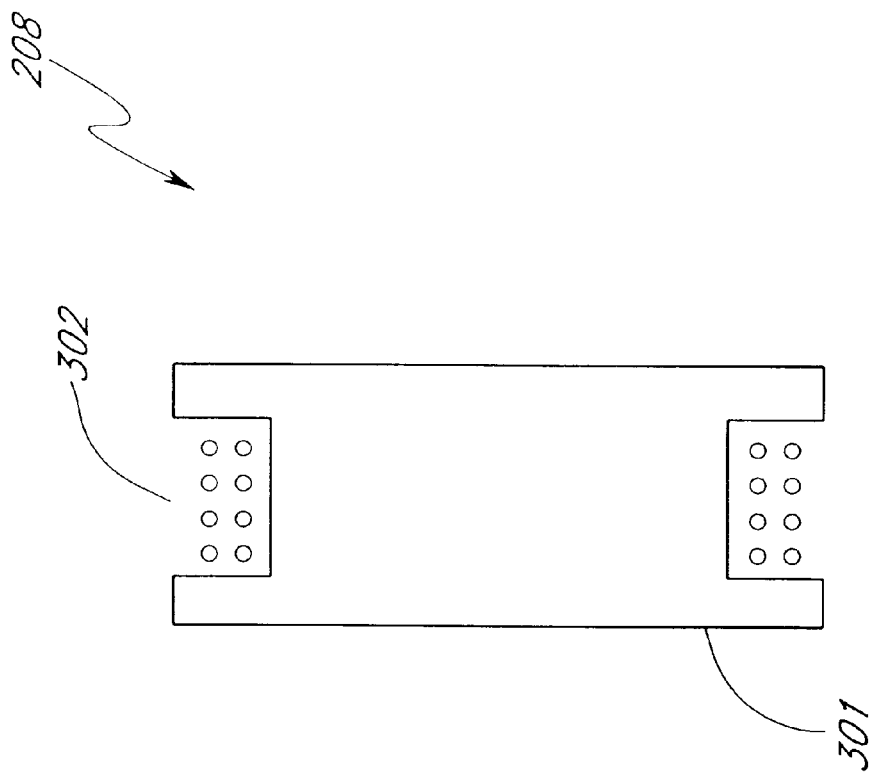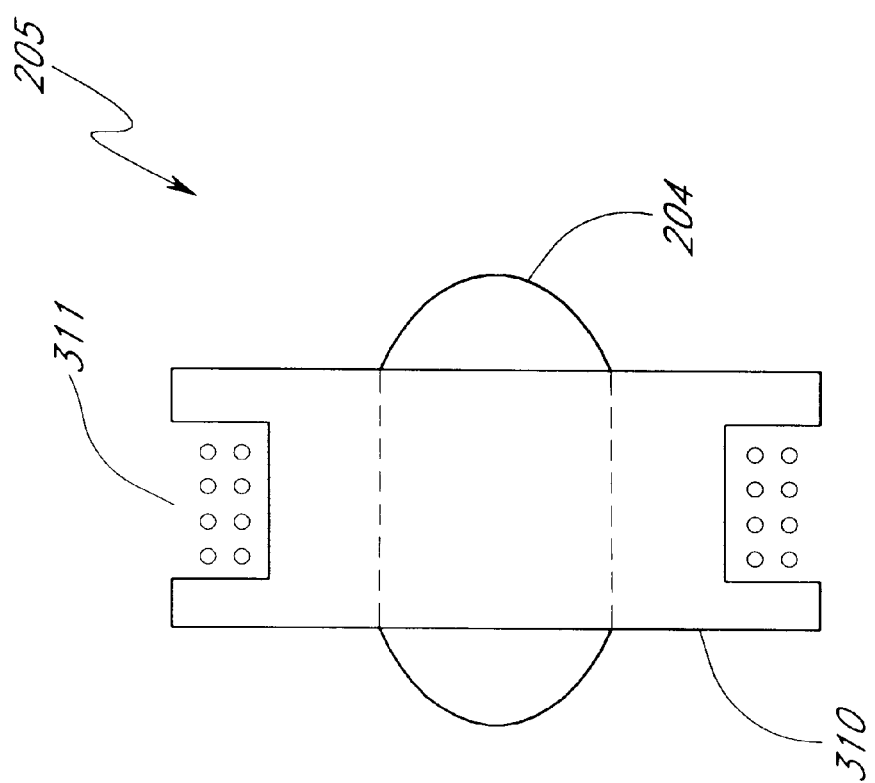
FIG. 3

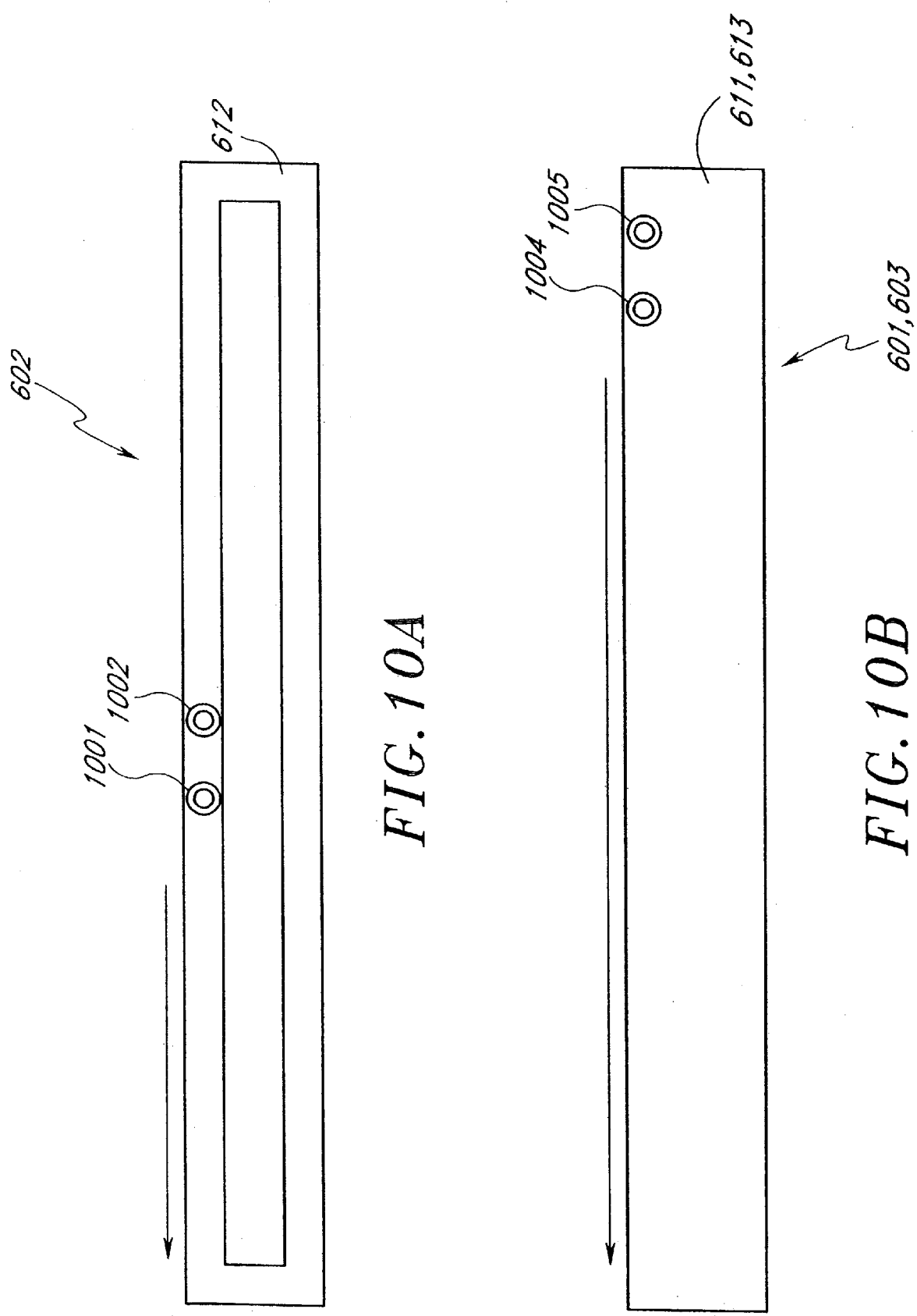

HYSTERESIS LOOP TRACER WITH SYMMETRIC BALANCE COIL

RELATED APPLICATIONS

The present application claims priority under 35 U.S.C. 119(e) from U.S. Provisional Application No. 60/140,002, filed on Jun. 18, 1999, and titled "HYSTERESIS LOOP TRACER WITH SYMMETRIC BALANCE COIL."

BACKGROUND OF THE INVENTION

1. Field of the Invention

The invention relates to instruments for measuring magnetic properties of materials, and more particularly, to pickup coils for magnetic hysteresis loop tracers.

2. Description of the Related Art

A magnetic hysteresis loop tracer (for example the SHB Instruments Model 109) operates by applying a strong AC magnetizing field ("H") to a sample under test, and then using a pickup coil surrounding the sample to monitor the response of the sample to the applied field. The response data is used to calculate a hysteresis loop (also known as a B-H curve) that shows the magnetic flux (B) in the sample as a function of the magnetizing field. The properties of the hysteresis loop are displayed by the instrument. The magnetizing field is created by current flowing in a drive coil (or coils). The pickup coil is part of a pickup assembly into which the sample under test is inserted.

One of the fundamental problems involved in the design and implementation of hysteresis loop tracers is the fact that the instrument must ignore the strong applied magnetizing field while detecting, integrating, and displaying the (typically much weaker) field caused by the interaction of the applied field with the sample under test. This is typically accomplished by the use of a single balance coil, positioned some distance "downstream" from the sample (that is, some distance along an axial centerline of a drive coil or coils) so that it responds to the magnetizing field of the drive coils, but not to the magnetization field from the sample. The signal from the balance coil is subtracted from the signal picked up by the pickup coil that surrounds the sample under test. This provides only a first-order correction, as the balance coil is neither identical to the pickup coil, nor is it positioned in exactly the same part of the magnetizing field as the pickup coil. Additional electronics are used to fine-tune this nulling (or "balancing") process so that, when properly adjusted, only the magnetization field from the sample is seen and measured by the instrument. Thermally and mechanically induced variations in the pickup and drive coil assemblies can easily interfere with proper balance of the system, and introduce significant measurement errors. This lack of proper balance is often evidenced by a tilt from the horizontal of the displayed hysteresis loop.

SUMMARY OF THE INVENTION

The present invention solves these and other problems by providing a geometry for a pickup coil assembly that improves the balance of a hysteresis loop tracer. In one embodiment, first and second balance coils are placed on either side (e.g., top/bottom, left/right, front/back, etc.) of a sample-sensing pickup coil. In one embodiment, the first and second balance coils are wired in series to form a symmetric balance coil that senses the magnetic H field on either side of the pickup coil. In one embodiment, the voltage produced by the symmetric balance coil is subtracted from the voltage produced by the pickup coil.

In one embodiment, the balance coil and the pickup coil are positioned symmetrically with respect to a centerline of a drive coil (or drive coils) to minimize measurement errors due to radial disturbances in the H field produced by the drive coils. Radial symmetry is provided by placing the balance coil on one side of the centerline and by placing the pickup coil on the other side of the centerline adjacent to the balance coil.

In one version, coil forms are used for winding the balance coil(s) and second pickup coil. In one embodiment, the coil forms are physically connected to each other in order to improve thermal and mechanical stability. In one version, the coil forms are constructed from alumina.

BRIEF DESCRIPTION OF THE FIGURES

The advantages and features of the disclosed invention will readily be appreciated by persons skilled in the art from the following detailed description when read in conjunction with the drawings listed below.

FIG. 3 is a side view of a pickup assembly that includes a balance coil and a pickup coil.

FIG. 10A shows one embodiment of a bobbin for the pickup coil.

FIG. 10B shows one embodiment of a bobbin for the balance coil.

Figure 1:
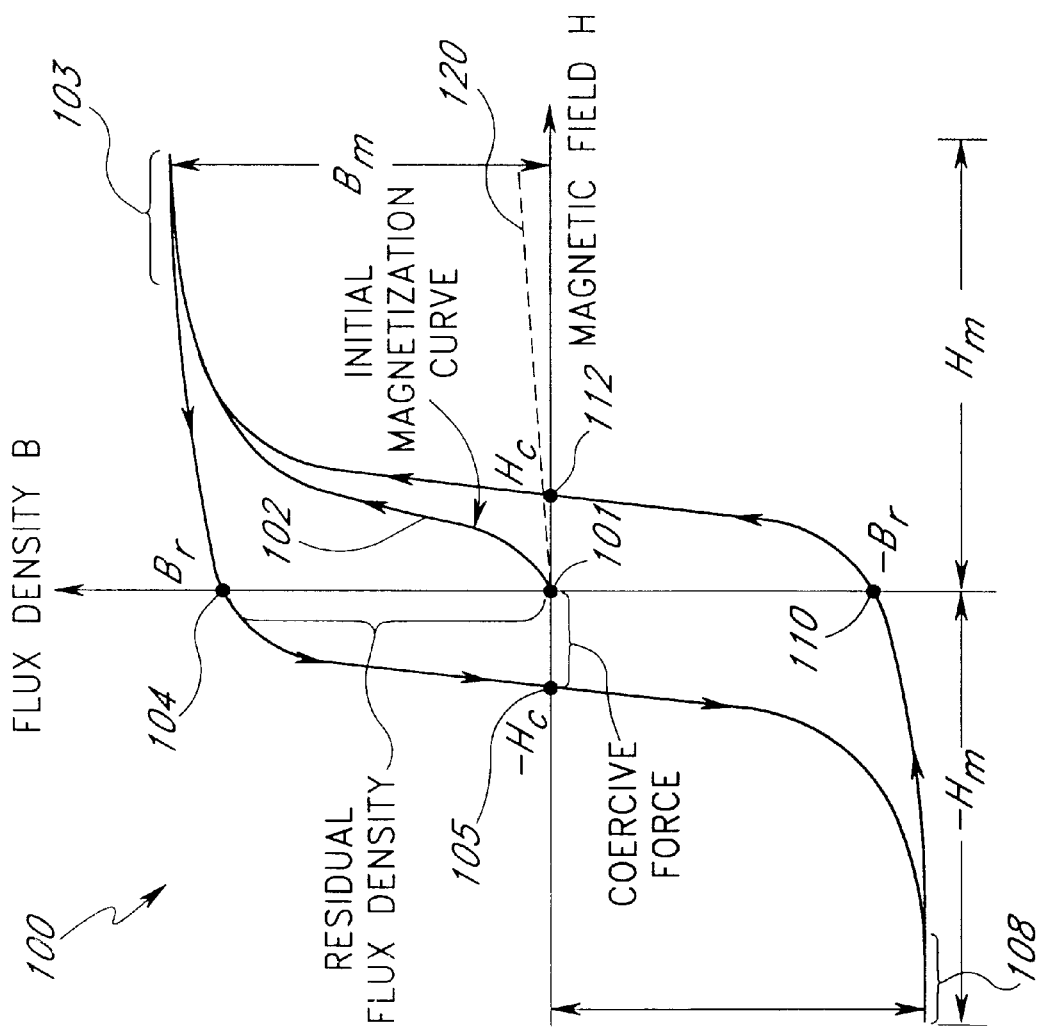
FIG. 1 is a B-H plot that illustrates the relationship between B and H for a sample of ferromagnetic material when the sample is subjected to a magnetizing field.

In the drawings, the first digit of any three-digit number generally indicates the number of the figure in which the element first appears. Where four-digit reference numbers are used, the first two digits indicate the figure number.

DETAILED DESCRIPTION OF THE PREFERRED EMBODIMENT

According to Ampère's law, an electric current produces a magnetic field vector H. In a non-ferromagnetic medium, such as air, the magnetic field H produces a magnetic flux vector B according to the linear relationship:

$$B = \mu_0 H \quad (1)$$

where $\mu_0$ is the permeability of free space, $\mu_0 = 4\pi \times 10^{-7}$. The magnetic flux B describes the direction and strength of the "flow" of magnetic force at a point in space. Lines of magnetic force always form loops. The B vectors along a particular loop point in the same direction around the loop (e.g., clockwise or counterclockwise). For, example, inside a bar magnet the flux vectors B point generally from the south pole to the north pole. Outside the bar magnet, the B vectors describe arcs that point from the north pole to the south pole.

Although magnetic effects in most materials are relatively weak, ferromagnetic materials exhibit strong magnetic effects. In ferromagnetic substances, the magnetic effects are produced by the motion of the electrons of individual atoms. The net effect is to make an atom of a ferromagnetic substance act like a miniature bar magnet. If a sample of ferromagnetic material is placed in a magnetic field, the small atomic bar magnets will align themselves with the applied field.

The permeability ($\mu$) of ferromagnetic materials is not a constant, but is a function of both the applied H field and of the previous magnetic history of the specimen. In a ferromagnetic material, the permeability of the material is given by:

$$\bar{\bar{\mu}} = \frac{B}{H} \quad (2)$$

In equation (2), B and H are vectors that do not necessarily point in the same direction and thus the permeability is shown as a tensor. For the sake of simplicity, and without loss of generality, the remainder of this disclosure will assume that the vectors B and H are parallel and thus the permeability is a scalar $\mu$. The extension from a scalar $\mu$ to a tensor $\bar{\bar{\mu}}$ will be obvious to one of ordinary skill in the art.

The magnetic properties of ferromagnetic materials can be measured by placing a sample of material in a magnetic field H and then measuring the flux density B of the sample in response to the applied field. The value of the H field applied to the sample is called the magnetizing force. In one embodiment, the H field is provided by an electric current in a coil of wire (the sample is placed inside the coil). The flux density B in the sample can be regarded as the result of the applied field H. The flux density can be measured by second coil of wire wrapped around the sample. The coil that provides the H field is typically called the drive coil (or magnetizing coil), and the coil that senses the flux density is typically called the pickup. A time-changing flux density B in the sample will cause an induced voltage to appear at the terminals of the pickup coil. The flux density in the sample can be measured by calculating the integral of the induced voltage.

FIG. 1 is a BH plot 100 that illustrates the relationship between B and H for a sample of ferromagnetic material when the sample is subjected to a magnetizing field. The B-H plot 100 shows the magnetic flux B (plotted on the y axis) in a sample of material as a function of an applied magnetizing field H (plotted on the x axis). The plot 100 begins at a location 101 (at the origin) where the sample is initially unmagnetized and the magnetizing field is zero (no current in the magnetizing coil). As the magnetizing field is increased (by increasing the current in the magnetizing coil), the flux density B increases rapidly along an initial magnetization curve 102. For comparison, a dashed curve 120, corresponding to $B = \mu_0 H$, is also shown in FIG. 1. The rapid rise in flux density B is caused by the atomic bar magnets rotating to align themselves with the applied magnetizing field H. Eventually, as the magnetizing field H continues to increase, most of the atomic bar magnets become aligned with the magnetizing field H and the magnetization curve reaches a saturation region 103. In the saturation region 103, the slope of the magnetization curve is approximately the same as that of curve 120 (because there are no more atomic bar magnets available to contribute to the flux density B).

If the H field applied to a sample is increased to saturation and is then decreased, the flux density B decreases, but not as rapidly as it increased along the initial-magnetization curve 102. Thus, when H reaches zero, at a point 104, there is a residual flux density, or remanence, $B_r$. At the point 104, the magnetizing field H is zero (no current in the magnetizing coil) and the sample has become a permanent magnet, having its own residual magnetic flux $B_r$ in the absence of any magnetizing field.

In order to reduce the magnetic flux B in the sample to zero, a negative magnetizing field $-H_c$ is applied. The value $-H_c$ occurs at a point 105 and is obtained by reversing the current in the magnetizing coil and increasing the current until a flux density B=0 is obtained. If H is further increased along the negative direction, the sample becomes magnetized with the opposite polarity, the magnetization at first being soft (meaning easily magnetized) and then hard as the flux in the sample approaches a reverse-polarity saturation region 108. Bringing the applied magnetizing field to zero again leaves a residual magnetization flux density $-B_r$, at a point 110. To reduce B to zero, a coercive force $+H_c$ is applied by increasing the current to produce a magnetizing field $H_c$ at a point 112. Increasing the magnetizing field past $H_c$ causes the magnetic flux B to again increase into the saturation region 103.

The phenomenon which causes B to lag behind H, so that the magnetization curves for increasing and decreasing fields are different, is called hysteresis, and the loop traced out by the magnetization curve between the saturation regions 103 and 108 is called the saturation hysteresis loop (or major hysteresis loop). The residual flux density $B_r$ on the saturation loop is called the retentivity, and the coercive force $H_c$ is called the coercivity. The retentivity of a substance is the maximum value that the residual flux density can attain and is a measure of the quality of the material for use as a permanent magnet. For a given material, no points can be reached on the B-H diagram outside the saturation hysteresis loop, but any point inside the saturation hysteresis loop can be reached.

In soft magnetic materials, the hysteresis loop is tall and thin ($H_c$ is relatively small as compared to $B_r$), and the hysteresis loop has little enclosed area. By contrast, in hard magnetic materials, the value of $H_c$ is relatively larger and the hysteresis loop has more enclosed area. The coercivity $H_c$ is a measure of how easy it is to magnetize or demagnetize a material. Soft materials, with a relatively smaller $H_c$, are easier to magnetize and easier to demagnetize than hard materials that have a relatively larger value of $H_c$.

Figure 2:
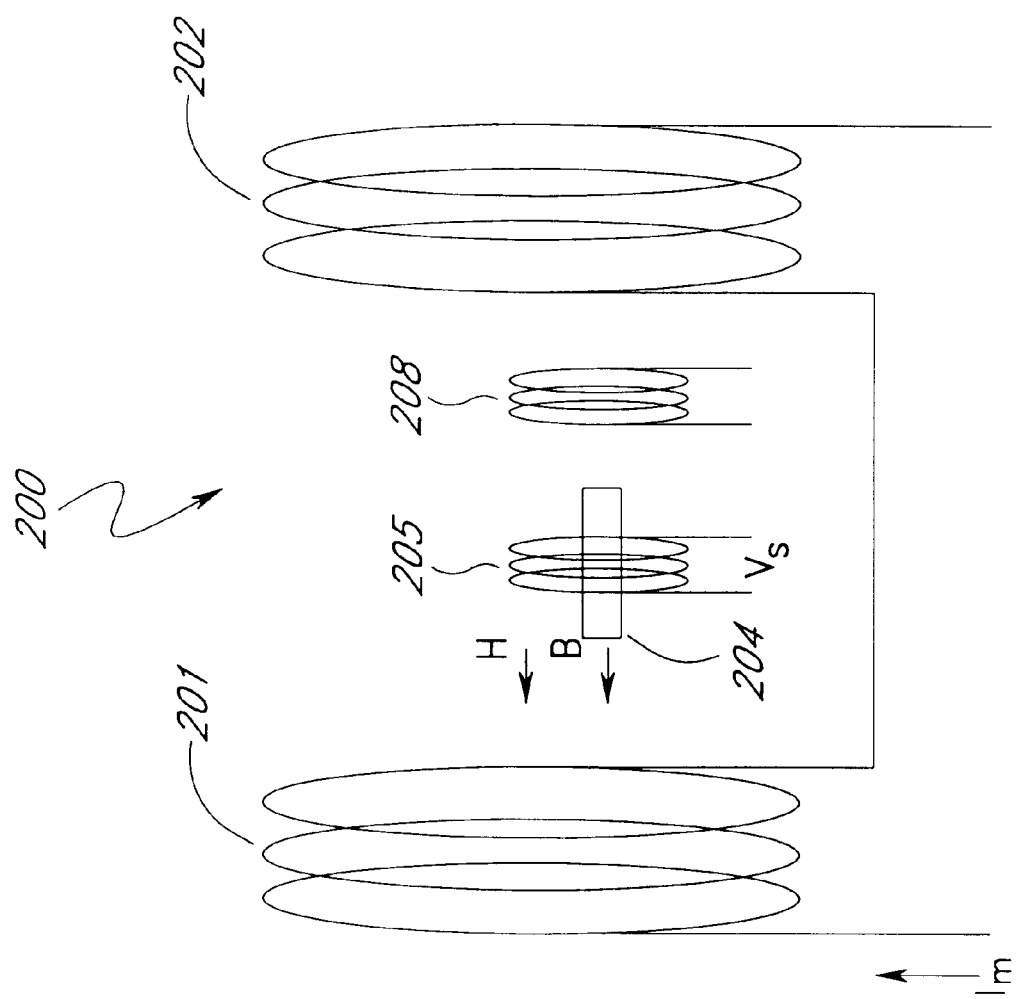
FIG. 2 is a schematic of a typical magnetic hysteresis loop tracer that operates by applying a strong alternating-current (AC) magnetizing H field to a sample.

FIG. 2 is a schematic of a typical magnetic hysteresis loop tracer that operates by applying a strong alternating-current (AC) magnetizing H field to a sample under test 204. The magnetizing field is provided by a pair of drive coils 201, 202. A pickup coil 205 surrounding the sample measures the response of the sample to the applied field (the pickup coil 205 detects the derivative of the sample magnetization flux, "B"). In a typical loop tracer, the inside dimensions of the pickup coil 205 are typically larger than the sample 204 to facilitate easy insertion and removal of the sample 204 from the pickup coil 205. Thus, the pickup coil detects time-changing magnetic flux in the sample 204 and time-changing magnetic flux in the vicinity of the sample 204.

Only the magnetic flux in the sample 204 is desired. So, a balancing coil 208 is used to sense the flux in the vicinity of the sample 204. The flux detected by the balancing coil 208 is subtracted from the flux detected by the pickup coil 205 to reduce the bias in the measured result caused by non-sample flux (that is, the drive flux) sensed by the pickup coil 205.

The magnetizing field is created by current flowing in the Helmholtz-type drive coils 201, 202. The two drive coils 201, 202 conveniently produce a relatively uniform field similar to a solenoid, while providing good access to the pickup coil 205. In one embodiment, the drive coils 201, 202 are combined into a solenoid-type drive coil.

Figure 4:
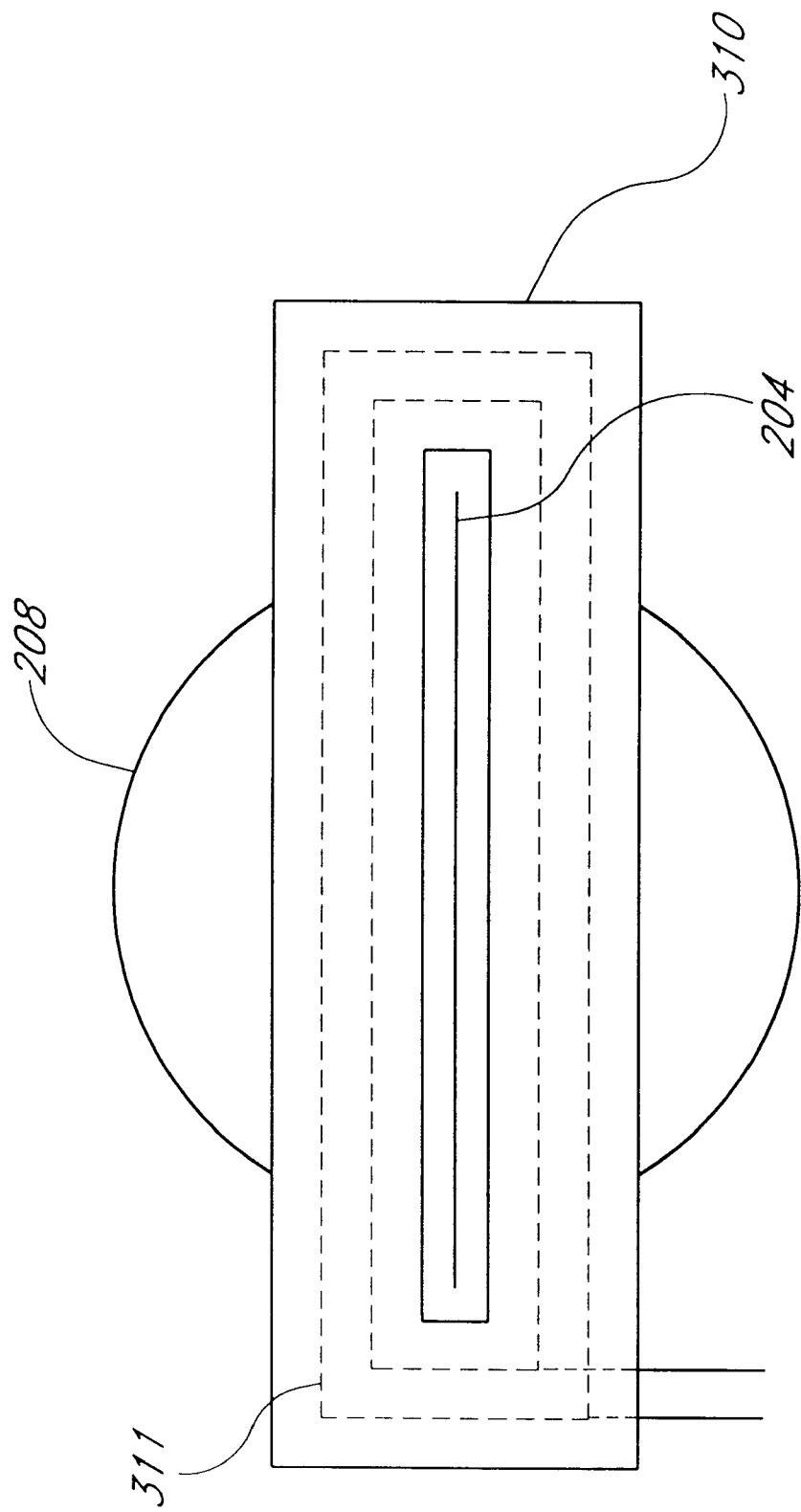
FIG. 4 is a front view of the pickup assembly shown in FIG. 3, showing the relationship between the balance coil and the pickup coil.

The pickup coil 205 is part of a pickup assembly into which the sample 204 is inserted. As shown in FIGS. 3 and 4, the pickup assembly includes the balance coil 208 and the sample-sensing pickup coil 205. The balance coil includes one or more turns of wire 302 wound on a coil form 301. The pickup coil 205 includes one or more turns of wire 311 wound on a coil form 310. Typically, the balance coil 208 is positioned so that it responds to the magnetizing field produced by the drive coils 201, 202, but does not respond to the magnetization field from the sample 204. The sample 204 is inserted in the pickup coil 205. The signal from the balance coil 208 is subtracted from the signal picked up by the pickup coil 205 that surrounds the sample 204. This provides only a first-order correction, as the balance coil 208 and the pickup coil 205 are typically not identical and are typically not positioned in the same part of the magnetizing field produced by the drive coils 201, 202. Additional electronics are used to fine-tune this nulling (or "balancing") process so that when properly adjusted, only the magnetization field from the sample 204 is measured.

In the prior art, the sample-sensing coil 204 is typically wound on a rectangular bobbin 310 that surrounds the sample 204. The balance coil is typically wound on a round bobbin 301 positioned to the rear of the pickup assembly. This location in the rear was chosen to keep the balance coil 208 as far from the sample 204 as practical, so that the balance coil 208 would not be influenced by the field generated by the sample 204.

Figure 5:
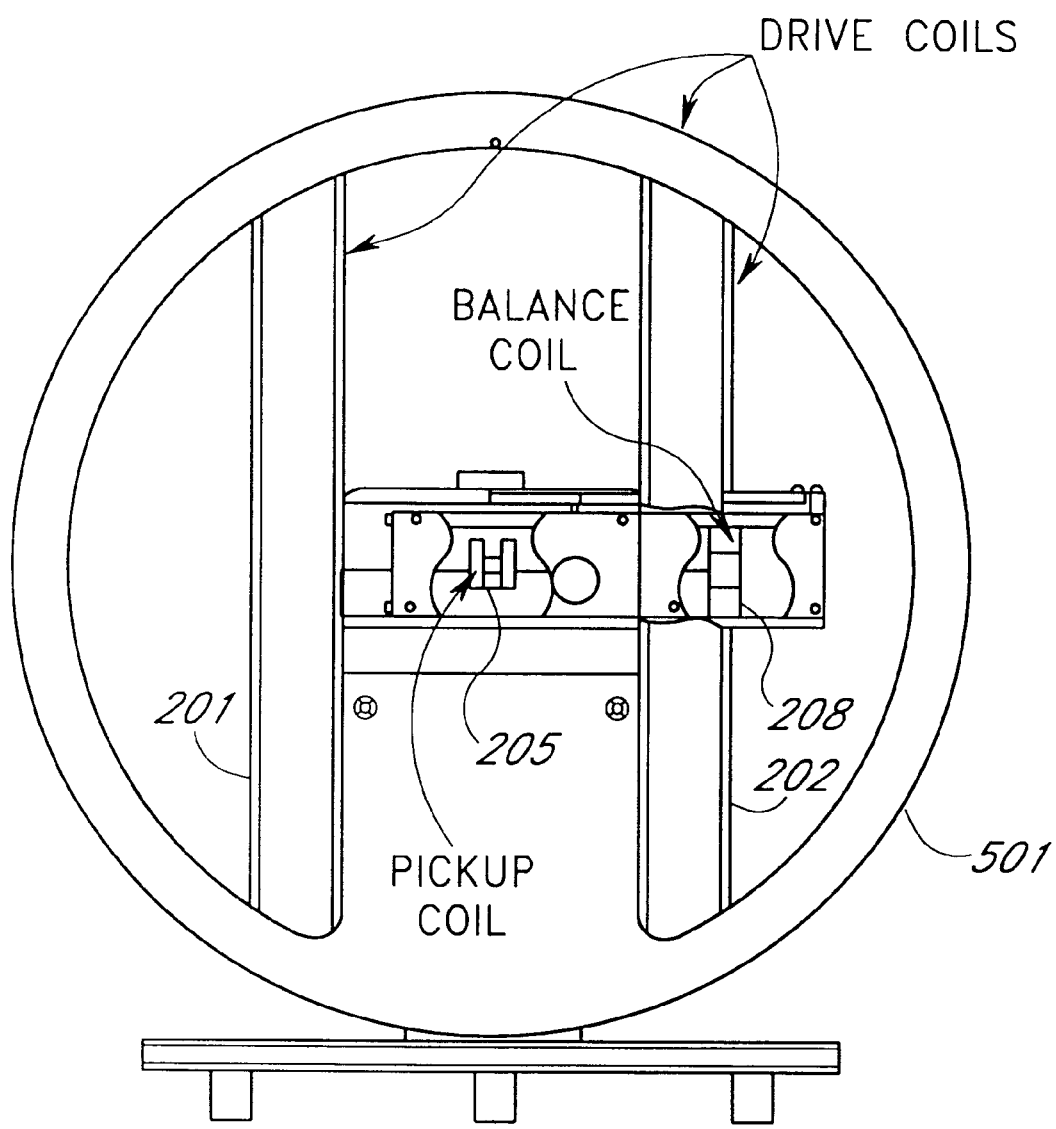
FIG. 5 shows a mechanical assembly that includes Helmholtz drive coils wound on coil forms, the pickup coil, and the balance coil mounted a distance from the pickup coil.

FIG. 5 shows a mechanical assembly that includes the drive coils 201, 202 wound on coil forms, the pickup coil 204, and the balance coil 208 mounted a distance from the pickup coil 204. FIG. 5 also shows additional drive coils, such as a drive coil 501 and a drive coil 502 (the coil 502 is behind the coil 501). The coils 501, 502 are oriented at right angles to the coils 201, 202. Thus, the magnetizing field produced by the drive coils 501, 502 is at right angles to the magnetizing field produced by the drive coils 201, 202 to allow the magnetic properties of the sample 204 to be measured at different orientations of the magnetizing field with respect to the sample 204.

Figure 6:
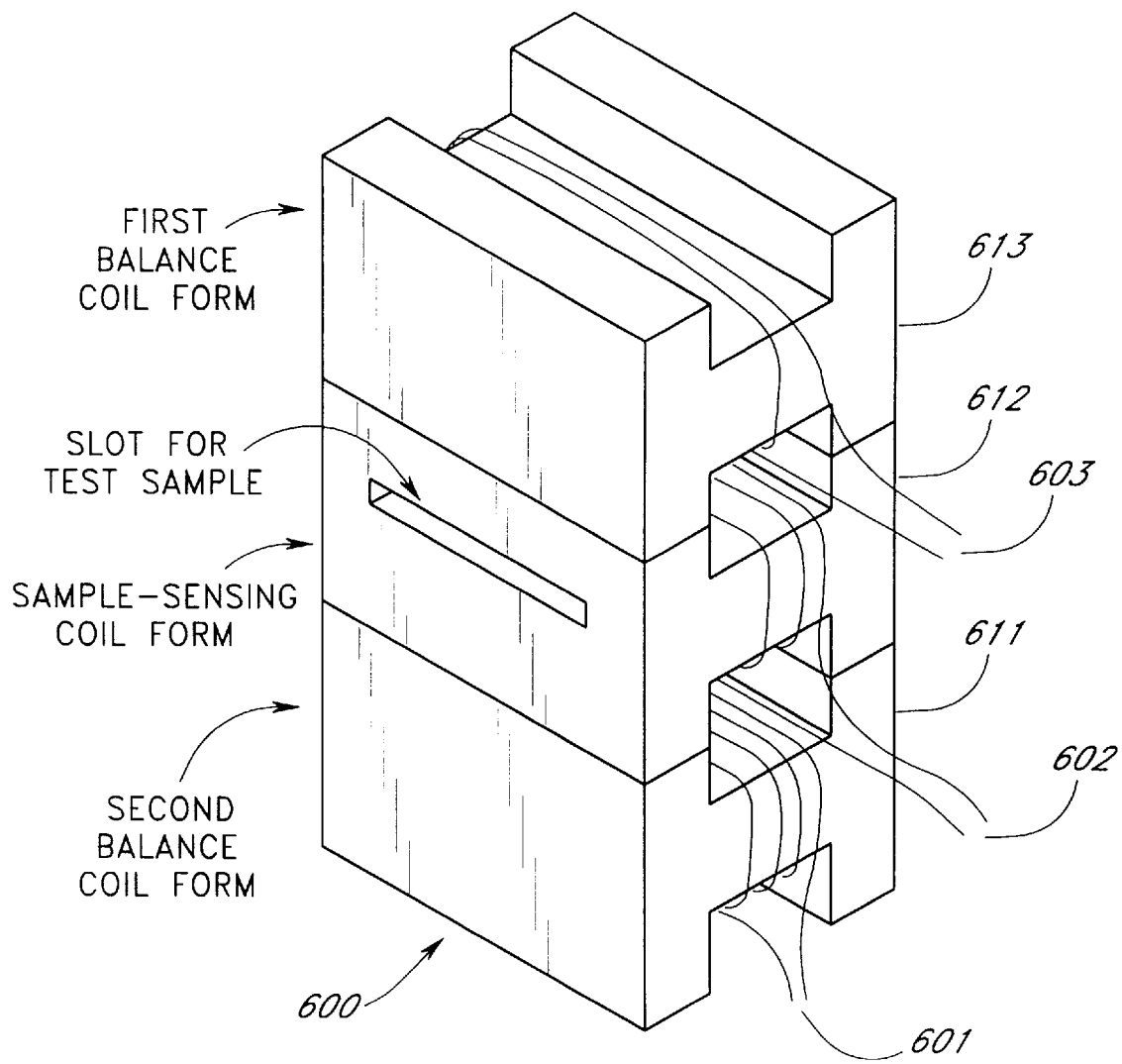
FIGS. 6 shows an improved pickup assembly wherein the rear-mounted balance coil shown in FIG. 5 is replaced by two balance coils mounted near the pickup coil.
Figure 7:
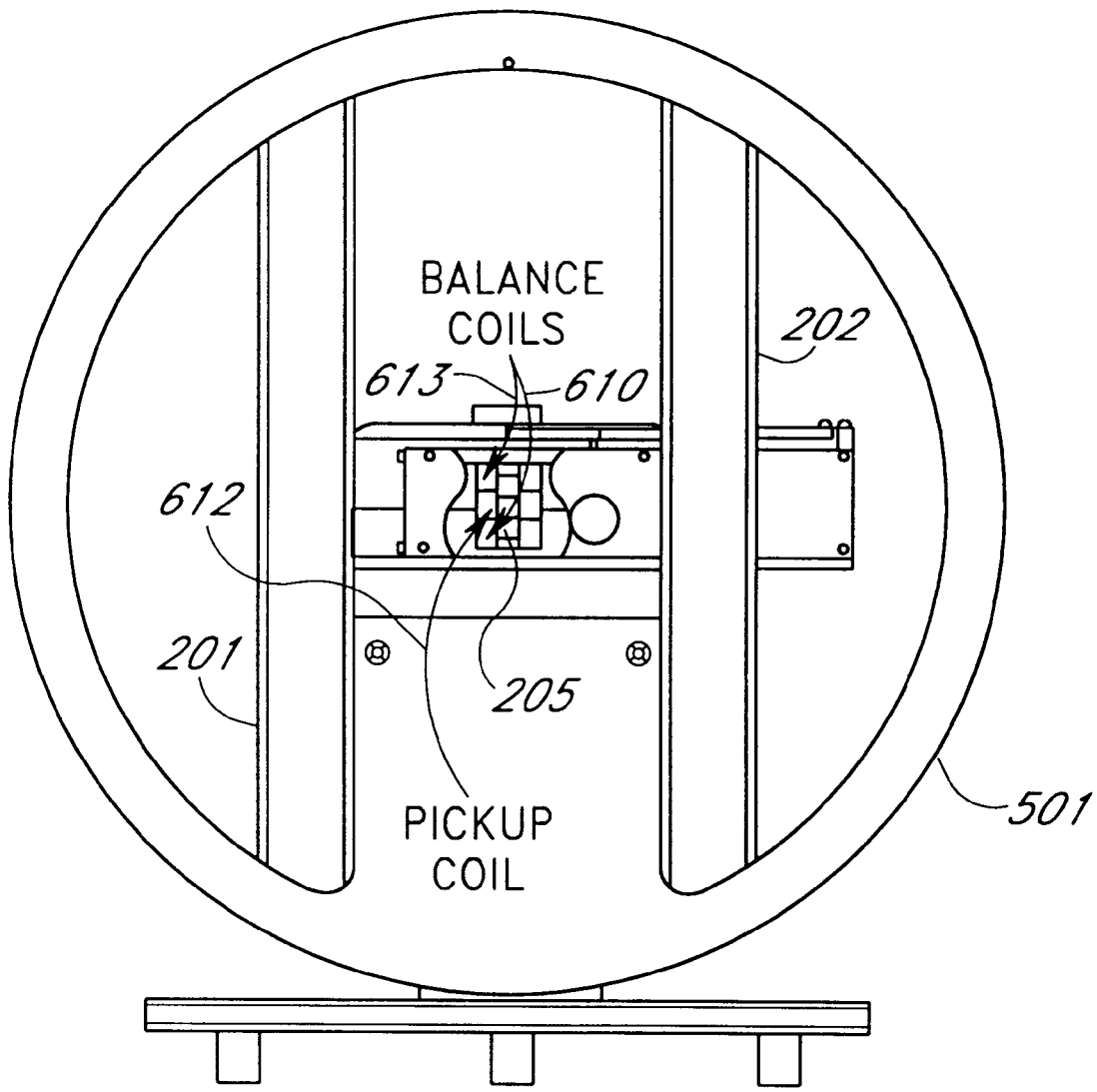
FIG. 7 shows the pickup assembly of FIG. 6 mounted between Helmholtz drive coils.

FIG. 6 shows an improved pickup assembly 600 wherein the rear-mounted balance coil 208 is replaced by two balance coils mounted near a pickup coil 602. FIG. 6 shows a lower balance coil 601 wound on a lower form 611, a pickup coil 602 mounted on a pickup coil form 612, and an upper balance coil 603 wound on an upper coil form 613. In one embodiment, the pickup coil 602 is placed between the two balance coils 601, 603. Mechanical and thermal stability of the pickup assembly is improved when the two balance coil forms 611, 612 are attached to the pickup coil form 612. The coil forms 611–613 can be constructed from any non-magnetic material. However, mechanical and thermal stability of the pickup assembly is further improved when the coil forms 611–613 are constructed from a mechanically and thermally stable material such as alumina or ceramic. FIG. 7 shows the pickup assembly 600 mounted between the drive coils 201, 202.

The balanced construction 600 shown in FIGS. 6 and 7 provides improved resistance to mechanical changes in the pickup assembly, improved balance, and improved mechanical rigidity of the pickup assembly. It also provides better immunity from changes in the magnetizing field due to effects such as vibrations of the drive coils 201, 202 and thermally induced motion of the drive coils 201, 202. The balanced construction 600 also provides reduced pickup of external fields, including undesired fields created by magnetic materials in proximity to the pickup assembly (e.g. magnetic materials in the connectors, switches, etc.). Measurement sensitivity is improved because signals from the sample 204 that are picked up by the balance coils 601 and 603 are added to the measurement value, rather than cancelled.

Figure 8:
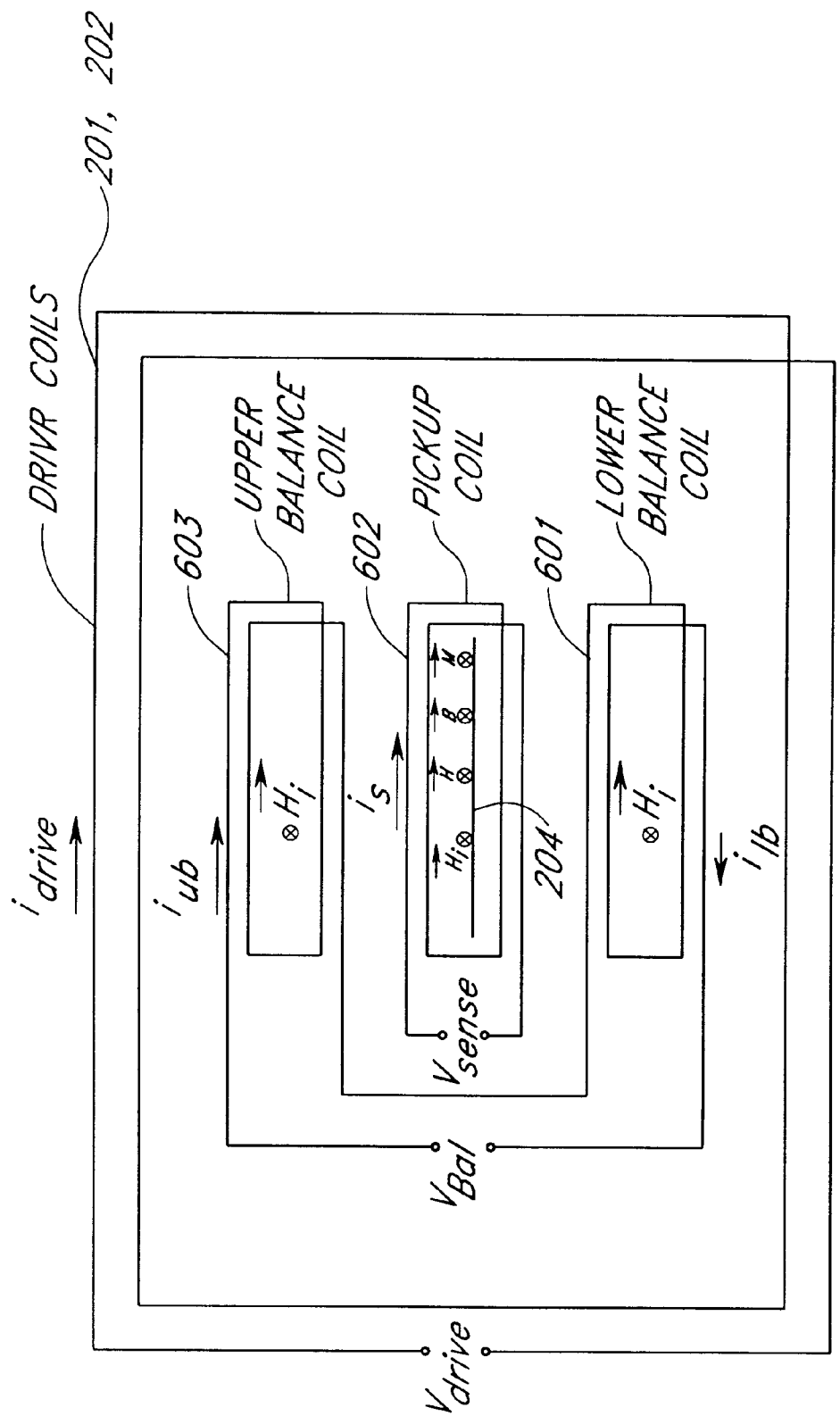
FIG. 8 is a schematic showing the drive coils, the first (lower) balance coil, the second (upper) balance coil, and the pickup coil.

FIG. 8 is a schematic showing the drive coils 201, 202, the first (lower) balance coil 601, the second (upper) balance coil 603, and the pickup coil 602. The first and second balance coils 601, 603 (wound on the forms 611, 613, respectively) are connected in series to produce a symmetric coil having an output voltage $V_{bal}$. The drive coils 201, 202 surround the pickup assembly. The sample 204 is disposed in the pickup coil 602 such that the pickup coil 602 senses the magnetic fields produced by the sample 204.

The drive coils 201, 202 create a time-changing magnetizing field $H_i$ that magnetizes the sample 204. Ideally, the field $H_i$ is spatially uniform in the vicinity of the balance coils and the pickup coil 602. More typically, the field $H_i$ is an approximation to a uniform field. The field $H_i$ is preferably approximately symmetric above and below the sample 204. In response to the field $H_i$, the sample 204 produces a magnetic flux $B_s$ and a corresponding field $H_s$. The symmetric coil (the series combination of the first and second balance coils 601, 603) produces a voltage $V_{bal}$ in response to the time-changing magnetic field $H_i$. However, the symmetric coil is relatively insensitive to the time-changing magnetic field $H_s$ produced by the sample. The sample sensing coil produces a voltage $V_{sense}=V_s+V_i$ in response to the sum of the field $H_i$ and the field $H_s$ inside the sample sensing coil 602; where $V_s$ is the component induced by the field $H_s$ and $V_i$ is the component induced by the field $H_i$.

The voltage $V_s$ (the voltage due to $H_s$) is the desired quantity. The symmetric balance coil is designed (by selecting the effective area enclosed by the first and second balance coils, and the number of turns in the first and second balance coils) such that $V_{bal}$ is approximately equal to $V_i$. Then, the desired value $V_s$ can be obtained approximately from $V_{sense}-V_{bal}$. This approximation to $V_s$ can be obtained by measuring $V_{sense}$ and $V_{bal}$ and then subtracting the two measured values.

FIG. 8 shows the lower balance coil 601 connected in series with the upper balance coil 603. One skilled in the art will recognize that the lower balance coil 601 and the upper balance coil 603 need not be physically connected. The voltages in the lower balance coil 601 and the upper balance coil 603 can be separately measured and later combined using analog and/or digital processing.

Figure 9:
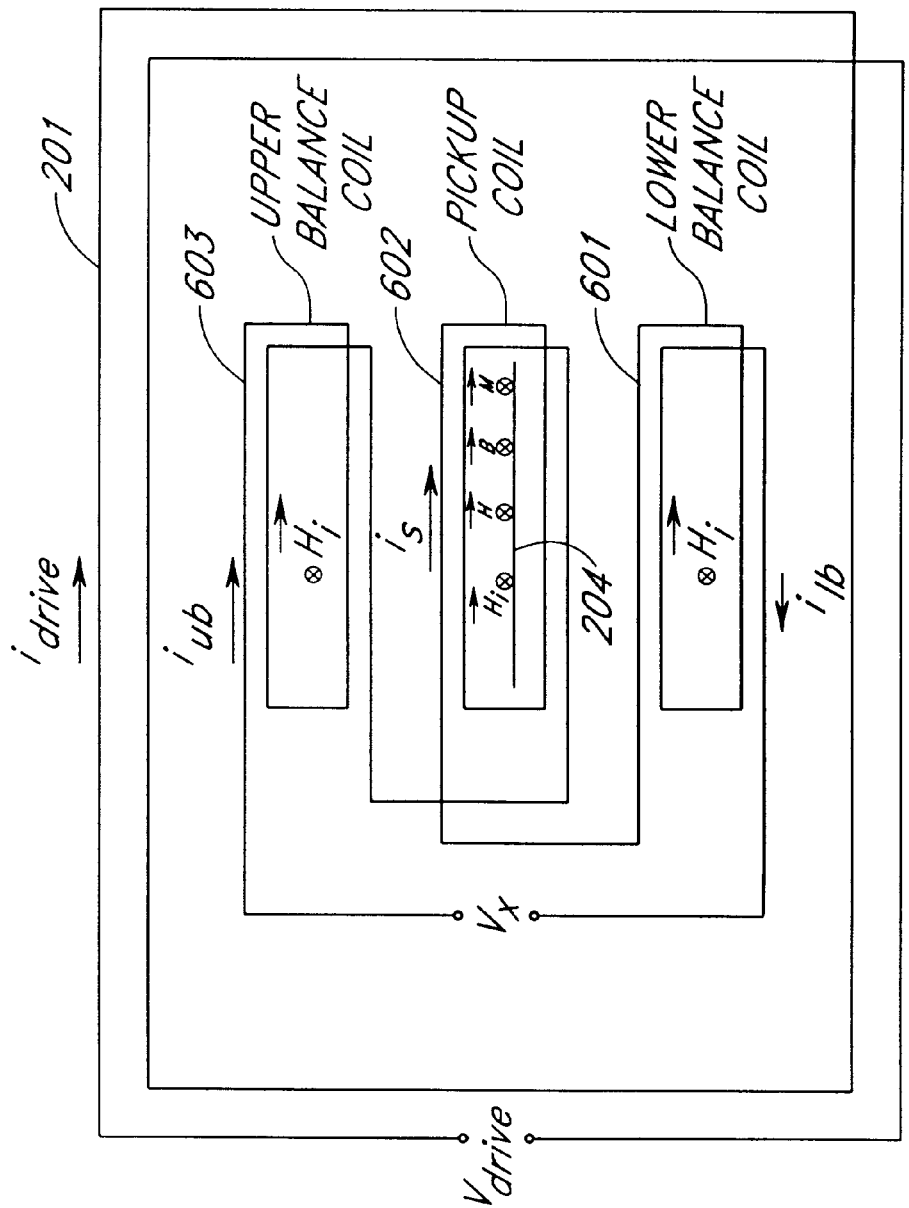
FIG. 9 is a schematic showing how the approximation to $V_s$ can be measured directly as a voltage $V_x$ by connecting the pickup coil in series with the two balance coils.

Alternatively, the approximation to $V_s$ can be measured directly as a voltage $V_x$ by connecting the pickup coil 602 in series with the two balance coils 601, 603 as shown in FIG. 9. Note that, as shown in FIG. 9, the polarity of the pickup coil 602 is reversed as compared to the two balance coils 601, 603.

FIG. 10 shows one embodiment of the pickup coil 602 and the balance coils 601, 603. In FIG. 10A, the pickup coil 602 is constructed using 2000 turns of #43 wire wound by starting and ending at terminals 1001, 1002 near the middle of the coil form 612. In FIG. 10B, the balance coils 601, 603 are each constructed using 600 turns of #43 wire wound starting and ending at terminals 1004, 1005 near the edge of the forms 611, 613. The coil forms 611, 613 are constructed from alumina.

Tilting of the pickup assembly or distortion of the drive coils 201, 202 can produce a field gradient in the region of the pickup assembly. The symmetry of the pickup assembly 600 is such that effects of this field gradient will be reduced.

In one embodiment, a loop tracer that produces relatively large magnetizing fields uses a water-cooled solenoid drive coil. In one embodiment, the solenoid drive coil is used to produce a magnetizing field in one direction, and a pair of Helmholtz-type coils, such as the coils 201, 202 shown in FIG. 2, are used to produce relatively lower strength magnetizing fields in other directions.

With a solenoid drive coil, especially when using high currents, mechanical distortions of the solenoid due to the magnetic fields are typically produced by the individual turns of wire around the solenoid. These distortions are typically in the form of radially symmetric expansion and contraction of the solenoid.

Figure 11A:
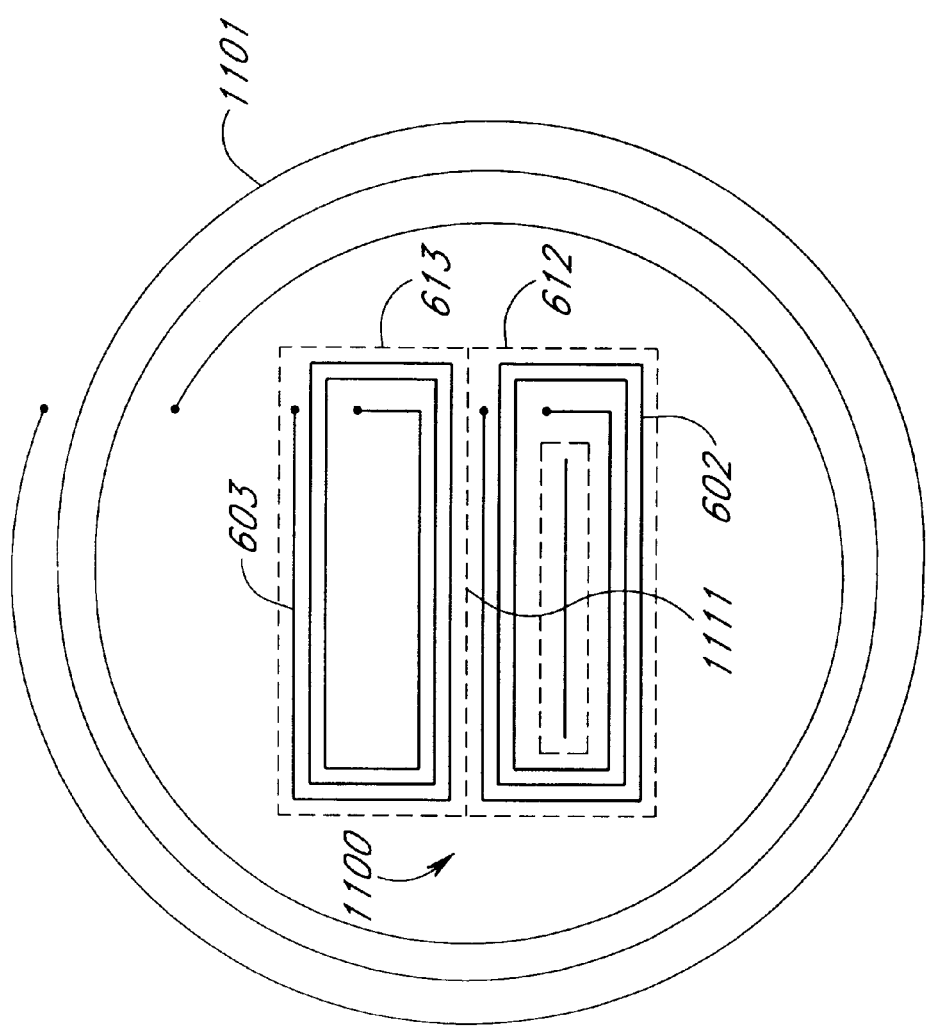
FIG. 11A is a perspective view of a two-bobbin pickup assembly configured to be used with a drive coil, or coils, such that the geometric center of the bobbins is at the center of the drive coil(s).
Figure 11B:
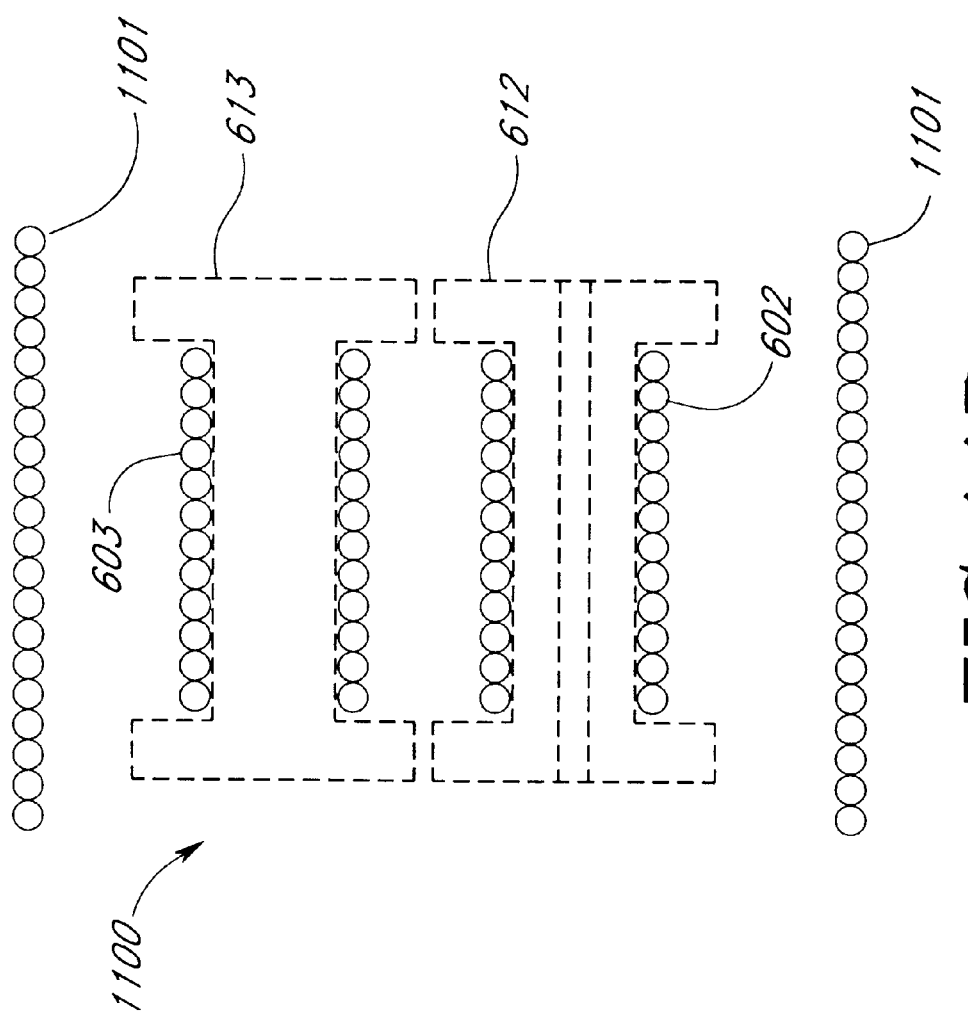
FIG. 11B is a perspective view of the two-bobbin pickup assembly shown in FIG. 11A placed at the center of a solenoid drive coil.

FIG. 11A is a perspective view of a two-bobbin pickup assembly 1100 configured to be used with a drive coil, or coils, such that the geometric center of the bobbins is at the axial center of the drive coil(s). FIG. 11B is a perspective view of the two-bobbin pickup assembly 1100 placed at the center of a solenoid drive coil 1101. The center of the drive coil 1101 is a center point 1111, which is placed at the axial center of a drive coil or coils (such as, for example, the drive coil 1101 as shown in FIG. 11B or the drive coils 201, 202). The balance coil 603, wound on the balance coil form 613, is placed on one side of the center point 1111. The pickup coil 602, wound on the pickup coil form 612, is placed on one side of the center point 1111.

The pickup assembly 1100 is relatively immune to radially symmetric changes in the field produced by the drive coil 1101. In one embodiment, the balance coil form 613 and the pickup coil form 612 are both made from similar materials to provide good thermal and mechanical stability. In one embodiment, the balance coil form 613 and the pickup coil form 612 are held together to improve thermal and mechanical stability.

Although the foregoing has been a description and illustration of specific embodiments of the invention, various modifications and changes can be made thereto by persons skilled in the art, without departing from the scope and spirit of the invention as defined by the following claims.

What is claimed is:

1. A pickup assembly for reducing imbalance in a hysteresis loop tracer, said pickup assembly comprising:
   a first balance coil;
   a second balance coil; and
   a pickup coil, said pickup coil disposed between said first and second balance coils.

2. The pickup assembly of claim 1, wherein said first and second balance coils are connected in series to form a symmetric balance coil that senses a magnetic flux on either side of said pickup coil.

3. The pickup assembly of claim 2, wherein said symmetric balance coil is connected in series with said pickup coil.

4. The pickup assembly of claim 2, wherein said symmetric balance coil is connected in series with said pickup coil such that when the pickup coil assembly is placed in a time-changing magnetic field, voltages induced in said symmetric balance coil are subtracted from voltages induced in said pickup coil.

5. The pickup assembly of claim 1, wherein said first balance coil, said second balance coil, and said pickup coil are wound on alumina forms.

6. The pickup assembly of claim 1, wherein said first balance coil is wound on a first balance coil form and said pickup coil is wound on a pickup coil form attached to said first balance coil form.

7. An apparatus for measuring magnetic fields, comprising:
   a first balance coil;
   a second balance coil; and
   a sensing coil, said sensing coil disposed near said first and second balance coils, said sensing coil configured to sense magnetic fields produced in a test sample.

8. The apparatus of claim 7, wherein said first and second balance coils are connected in series to form a symmetric balance coil.

9. The apparatus of claim 8, wherein said symmetric balance coil is connected in series with said sensing coil.

10. The apparatus of claim 9, wherein said symmetric balance coil is connected in reverse-polarity series with said sensing coil.

11. The apparatus of claim 7, wherein at least one of said first balance coil, said second balance coil, and said sensing coil is wound on an alumina form.

12. The apparatus of claim 7, wherein said first balance coil is wound on a first balance coil form and said sensing coil is wound on a sensing coil form attached to said first balance coil form.

13. The apparatus of claim 7, wherein said sensing coil is disposed between said first and second balance coils.

14. The apparatus of claim 7, further comprising one or more driving coils, said driving coils configured to generate magnetic fields in said first balance coil, said second balance coil, and said sensing coil.

15. The apparatus of claim 14, wherein said sensing coil is configured to measure a magnetic field produced by a material sample magnetized by an H field produced by said one or more driving coils.

16. An apparatus for measuring magnetic fields, comprising:
   means for sensing a first magnetic field above a sample;
   means for sensing a second magnetic field below a sample; and
   means for sensing a third magnetic field around a sample.

17. The apparatus claim 16, wherein an output of said means for sensing a first magnetic field is added to an output of said means for sensing a second magnetic field to produce a balanced output.

18. The apparatus of claim 17, wherein said balanced output is subtracted from an output of said means for sensing a third magnetic field.

19. The apparatus of claim 16, wherein said means for sensing a first magnetic field produces a voltage proportional to a time-change in a magnitude of said first magnetic field.

20. The apparatus of claim 16, wherein said third magnetic field occurs in a region between said first magnetic field and said second magnetic field.

21. The apparatus of claim 16, further comprising means for producing a magnetizing field.

22. The apparatus of claim 16, wherein said third magnetic field occurs in a sample under test.

23. A method for measuring a magnetic flux in a test sample, comprising the acts of:

sensing a time-derivative of a magnetic flux above said test sample as a first flux measurement;

sensing a time-derivative of a magnetic flux below said test sample as a second flux measurement;

sensing a time-derivative of a magnetic flux in said test sample as a third flux measurement; and using said first flux measurement, said second flux measurement, and said third flux measurement to calculate a magnetic flux in said sample.

24. An apparatus for measuring magnetic fields, comprising:

a balance coil; and a pickup coil, wherein said balance coil is wound on a balance coil form and said pickup coil is wound on a pickup coil form attached to said balance coil form, said pickup coil and said balance coil disposed symmetrically about a centerline of a drive coil.

25. The apparatus of claim 24, wherein at least one of said balance coil and said pickup coil is wound on an alumina form.

26. The apparatus of claim 24, wherein said balance coil form is integral with said pickup coil form.

27. The apparatus of claim 24, further comprising one or more driving coils, said driving coils configured to generate magnetic fields in said balance coil and said pickup coil.

28. The apparatus of claim 24, wherein said pickup coil is configured to measure a magnetic field produced by a material sample magnetized by an H field produced by said driving coil.

29. The apparatus of claim 24, wherein said drive coil comprises a Helmholtz coil.

30. The apparatus of claim 24, wherein said drive coil comprises a solenoid.

* * * * *